(12) United States Patent
Jain et al.

(10) Patent No.: US 10,453,705 B2
(45) Date of Patent: Oct. 22, 2019

(54) MULTI-VOLTAGE APPARATUS FOR ELECTRONICS PACKAGE INCLUDING MAGNETIC INDUCTOR AND CAPACITOR AND MANUFACTURING THEREOF

(71) Applicant: Intel Corporation, Santa Clara, CA (US)

(72) Inventors: Amit K. Jain, Portland, OR (US); Sameer Shekhar, Portland, OR (US); Kaladhar Radhakrishnan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/865,471

(22) Filed: Jan. 9, 2018

(65) Prior Publication Data

US 2019/0214276 A1 Jul. 11, 2019

(51) Int. Cl.
| | |
|---|---|
| *H01L 21/56* | (2006.01) |
| *H01F 17/04* | (2006.01) |
| *H02J 50/10* | (2016.01) |
| *H01F 27/24* | (2006.01) |
| *H01L 23/64* | (2006.01) |
| *H01L 21/48* | (2006.01) |

(Continued)

(52) U.S. Cl.
CPC ....... *H01L 21/563* (2013.01); *H01F 17/0006* (2013.01); *H01F 17/04* (2013.01); *H01F 27/24* (2013.01); *H01L 21/4857* (2013.01); *H01L 23/645* (2013.01); *H02J 50/10* (2016.02); *H05K 1/0233* (2013.01); *H05K 1/165* (2013.01)

(58) Field of Classification Search
CPC ............... H01L 27/0288; H01L 28/10; H01L 2924/1206; H01L 2924/19042; H01L 27/0805; H01L 28/40; H01L 2924/1205; H01L 21/563; H01L 21/4857; H01L 23/645; H01L 28/41–92; H01L 29/7408; H01L 27/0629; H02J 50/10; H01F 17/0006
See application file for complete search history.

(56) References Cited

U.S. PATENT DOCUMENTS

2010/0187003 A1* 7/2010 Tsai ................ H05K 3/205
 174/263
2010/0265009 A1* 10/2010 Horng ............... H03H 7/0115
 333/185

(Continued)

*Primary Examiner* — Shahed Ahmed
(74) *Attorney, Agent, or Firm* — Schwegman Lundberg & Woessner, P.A.

(57) ABSTRACT

Apparatuses and methods including an apparatus for an electronics package are disclosed. According to one embodiment, the apparatus can include one or more magnetic inductors, one or more capacitors positioned one of above or below to the one or more magnetic inductors and a plurality of electrical conductors comprising pillars. The pillars can extend substantially vertically to electrically connect the one or more magnetic inductors and the one or more capacitors to the electronics package and the one or more magnetic inductors, the one or more capacitors and the plurality of conductors are disposed one of above or below the electronics package; and at least one electrical conductor comprising a pillar extending substantially vertically to electrically connect the one or more magnetic inductors and the one or more capacitors.

16 Claims, 9 Drawing Sheets

(51) Int. Cl.
*H01F 17/00* (2006.01)
*H05K 1/16* (2006.01)
*H05K 1/02* (2006.01)

(56) References Cited

U.S. PATENT DOCUMENTS

2015/0181733 A1* 6/2015 Lu ..................... H01L 23/49811
  361/811
2017/0243690 A1* 8/2017 Chen ................... H01F 27/2804
2018/0343041 A1* 11/2018 Luzinski .............. H04B 5/0037

* cited by examiner

MULTI-VOLTAGE APPARATUS FOR ELECTRONICS PACKAGE INCLUDING MAGNETIC INDUCTOR AND CAPACITOR AND MANUFACTURING THEREOF

TECHNICAL FIELD

This document pertains generally, but not by way of limitation, to electronics packages, such as voltage regulators, and to apparatuses and methods that can be utilized with electronics packages.

BACKGROUND

Electronics packages, such as integrated circuit packages can include a voltage regulator to maintain voltages used by components in an electronic device or system at proper values. The voltage regulator includes such components as inductors and/or capacitors. For example, voltage regulators (VRs) can be used in the circuit packages to reduce or increase the voltage of a power supply to an operating voltage of the integrated circuit package.

Voltage regulators are often designed to operate within specific parameters, such as output voltage ripple, overshoot voltages, efficiency, power overhead and input power delivery network (PDN) impedance. For some types of voltage regulators, avoiding design impacts on these parameters may pose a challenge given a demand for smaller and smaller integrated circuit packages. For example, output voltage ripple, overshoot voltages and PDN impedance have grown due to limited on-die capacitance reduction and load transients have increased to support competitive processor core performance.

Voltage ripple is currently mitigated either via large inductors that take up valuable space on the electronics package and additionally cause poor transient load performance. Alternatively, voltage ripple can be mitigated via re-partitioning at a full chip level. Voltage overshoot mitigation generally requires lower inductance and/or complex active clamp circuitry to limit maximum voltage seen by load. These current mitigation measures and other factors add complexity and cost to electronic device design and fabrication.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
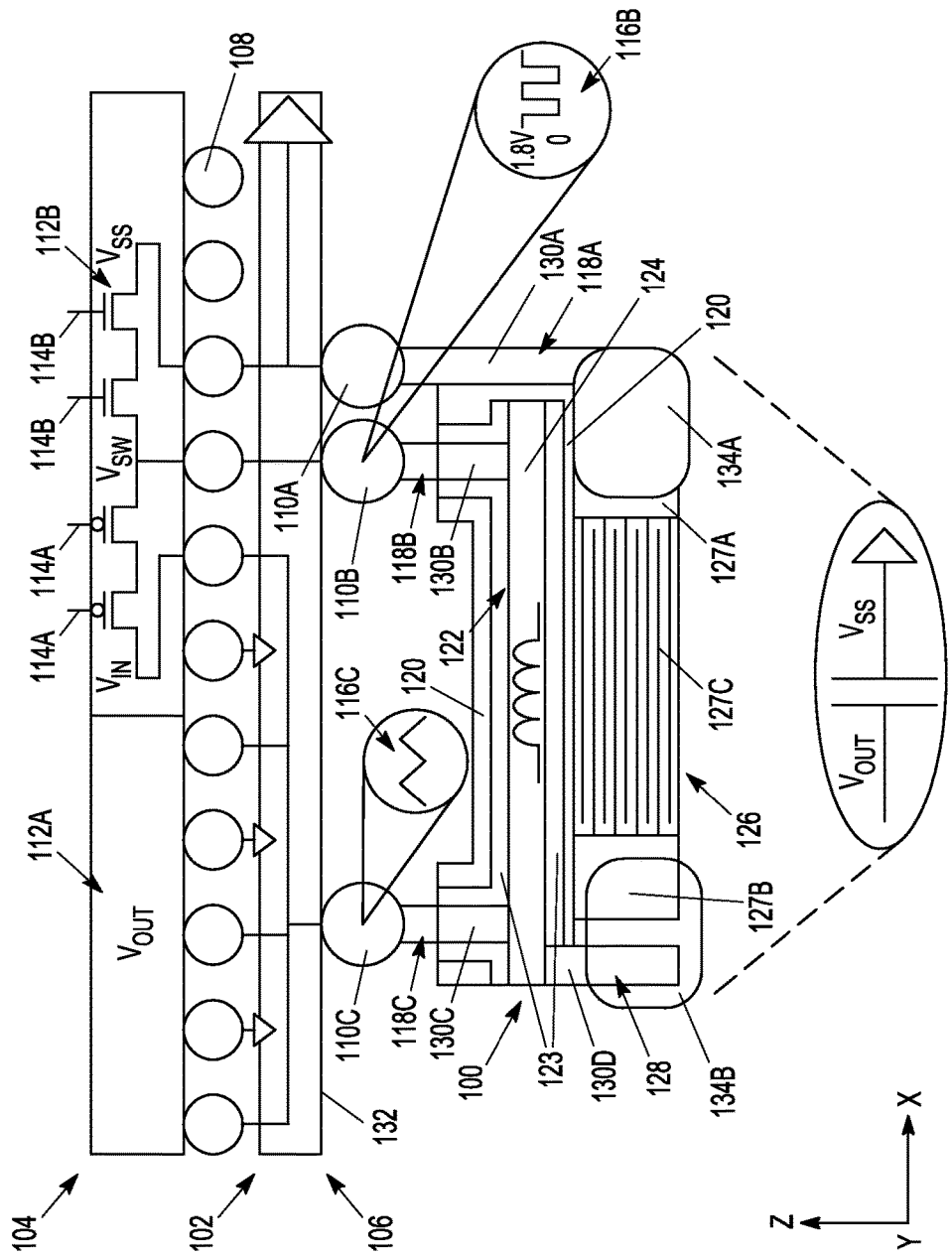
FIG. 1 is a schematic plane view showing portions of a die, an electronics package and an apparatus according to a first example.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Electronics packages, such as Integrated Circuits (ICs) including Integrated Voltage Regulators (IVRs) are contemplated for use with the present apparatuses. These apparatuses can be integrated with electronics packages during initial fabrication, or in some cases, can be retro-fitted into existing electronics packages at some time after fabrication. As the surface area of electronics packages is desired to be limited, the present application contemplates apparatuses that arrange one or more inductors and one or more capacitors above or below a major surface (e.g., a bottom surface formed by buildup layers of a substrate and/or a top surface formed by the buildup layers of the substrate) of the electronics package. Such arrangement can include the vertical stacking of the one or more inductors and one or more capacitors according to some examples. Due to the positioning above or below the electronics package, these apparatuses occupy less surface area as they can dispose the inductor(s), capacitor(s) and other components above and/or below one the major surface of the electronics package.

There is a need for higher total capacitance for VR output filtering and for additional capacitance for absorbing load transient currents to stay within reliability and minimum voltage limits. The present example apparatuses address these needs, and indeed, can address three challenges simultaneously: output voltage ripple mitigation; over-shoot mitigation; and input PDN impedance mitigation. Current solutions (like inductance optimization) can only optimize either ripple or transient performance. Furthermore, die capacitance beyond the circuit die area is not guaranteed with current solutions across product lines or even in the same generation of product. In contrast, the present apparatuses can be modified to address topology differences across product lines. Furthermore, the present apparatuses can de-couple capacitance from the die and do not require increased electronics package size as discussed above. Thus, the disclosed apparatuses can address demands for smaller and smaller integrated circuit packages as well as address topology differences across product lines.

According to some examples, the apparatuses disclosed position the one or more capacitors disposed above or below to the one or more inductors. The one or more capacitors can be insulated from the one or more inductors. The apparatuses can include a plurality of electrical conductors comprising pillars that extend substantially vertically to electrically connect the one or more inductors and the one or more capacitors to the electronics package (e.g., the voltage regulator). Thus, the one or more capacitors and the plurality of conductors are disposed one of above or below the electronics package. The apparatuses can also include at least one electrical conductor also comprising a pillar extending substantially vertically to electrically connect the one or more inductors and the one or more capacitors.

Such arrangement for the apparatuses can free up space on the electronics package disposing the apparatus vertically above or below. The electronics package avoids routing difficulties around components that require a specific position on the electronics package substrate, such as traces and electrical contacts.

According to some examples, the apparatuses each comprise a single component with the vertically stacked magnetic inductor(s) and capacitor(s). The apparatuses can be configured for in-package integration with VRs. According to some examples, the capacitor(s) can be connected in close proximity to the "cold" end of a multi-phase magnetic inductor used in VRs to provide effective output voltage ripple and transient mitigation. In yet further examples, the capacitor(s) can be connected to input voltage of the IVRs for input power distribution network impedance mitigation. Further structure variations such as modification of the type of electrical conductors, the locations of such electrical conductors, the number of the electrical conductors, the number and/or type of inductors and/or capacitors, the circuit type the apparatus is utilized in are disclosed. These components variations can be made as desired to suit different DC to DC power converter topologies. Apparatuses configured for multiple voltage rails and package embedding and fabrication processes are disclosed herein as well.

FIG. 1 is a plane view of an apparatus 100 that can be used with an electronics package 102 and die 104. FIG. 1 shows the apparatus 100 arranged with the electronics package 102 in an output voltage filter configuration.

The electronics package 102 can include, but is not limited to, a processor, microprocessor, memory module, radio-frequency circuit, radio-frequency filter, phase-locked loop (PLL) filter, other type of filter, or the like. The portion of the electronics package 102 shown can comprise a VR 106 according to the example of FIG. 1.

In one example, the die 104 can be fabricated from a silicon wafer, gallium arsenide, or other semiconductor. The die 104 can include, but is not limited to, electronic circuit(s), a processor, microprocessor, random access memory, radio, arithmetic unit, any combination thereof, or the like. It should be noted that the electronics package 102, the die 104 and portions of the apparatus 100 are shown in a schematic manner in FIG. 1 to aid the interpretation of the reader by eliminating undesired detail.

As shown in the example of FIG. 1, the die 104 can be positioned above and electrically connected to the electronics package 102 such as by electrical contacts 108 (e.g., die bumps) or another type of electrical contacts. The electronics package 102, here the VR 106, can be electrically connected to the apparatus 100 via electrical contacts 110A, 110B and 110C. Such electrical contacts 110A, 110B and 110C are each illustrated as a Ball Grid Array (BGA) however, the electrical contacts 110A, 110B and 110C can comprise any of BGAs, Land Grid Arrays (LGAs), Pin Grid Arrays (PGAs), surface mounts, through-holes, or the like, for example.

In the example of FIG. 1, the die 104 includes circuits 112A and 112B, such as integrated circuits. The circuit 112A carries an output voltage (Vout) from the apparatus 100 and the electronics package 102. The circuit 112B carries an input voltage (difference between Vin and Vss) to the apparatus 100. The circuit 112B includes switches 114A & 114B that can be opened and closed to modulate the input voltage to the apparatus 100 between Vsw (used here to indicate input voltage with the switch(es) 114A closed and 114B open) and Vss (used here to indicate input voltage with the switch(es) 114A open and 114B closed). The resulting switched voltages Vsw from such an arrangement are shown as exemplary electrical waveform 116B taken at the electrical contact 110B.

In the example of FIG. 1, the apparatus 100 includes a first plurality of electrical conductors 118A, 118B and 118C, an insulator 120, an inductor 122, a capacitor 126 and a second electrical conductor 128. The inductor 122 includes a magnetic material 123 and an inductor trace 124.

As shown in FIG. 1, the first plurality of electrical conductors 118A, 118B and 118C are coupled to the electrical contacts 110A, 110B and 110C, respectively, to facilitate electrical connection therebetween. Each of the first plurality of electrical conductors 118A, 118B and 118C comprise a pillar 130A, 130B and 130C (e.g., a trace formed of one or more of nickel, brass, silver, copper, gold, tin, conductive ink, metal clad laminate or the like) with a major dimension in a substantially vertical direction.

Each pillar 130A, 130B and 130C is oriented to extend substantially vertically (here in the z-direction of the Cartesian coordinate system) along the major dimension from the electrical contacts 110A, 110B and 110C to the apparatus 100. As used herein, the term "vertically" describes an orientation where the major dimension (extent) of the pillar/connection is substantially transverse to one or more major surface(s) 132 (i.e. here a bottom surface) of the electronics package 102. Thus, the pillars 130A, 130B and 130C have the major dimension that is oriented substantially (e.g., within about 25 degrees) transverse to the major surface 132 of the electronics package 102. Here the major surface 132 of the electronics package 102 is shown to extend in both the x-direction and y-direction of the Cartesian coordinate system provided.

The electrical conductor 118A is electrically connected to electrical contact 110A and extends substantially vertically to electrically connect to a first metalized end portion 127A of the capacitor 126 via connection 134A. The connection 134A can comprise a solder connection for example. The electrical conductor 118B is electrically connected to electrical contact 110B and extends substantially vertically to electrically connect to a first end portion of the inductor 122 such as to the inductor trace 124. Such connection to the inductor trace 124 can be by solder or by integration via deposition, for example. The electrical conductor 118C is electrically connected to electrical contact 110C and extends substantially vertically to electrically connect to a second end portion of the inductor 122 such as to the inductor trace 124. Such connection to the inductor trace 124 can be by solder or by integration via deposition, for example.

Figure 2:
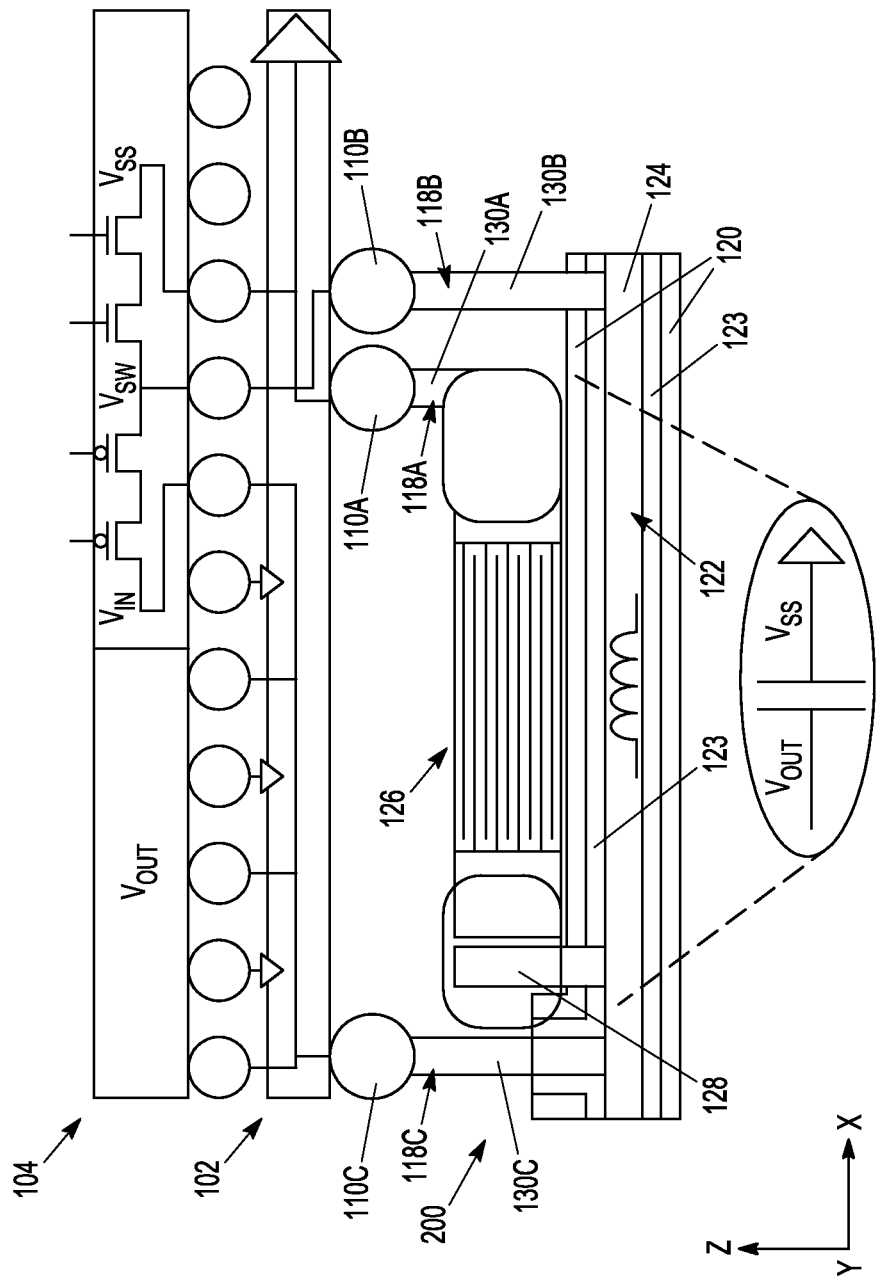
FIG. 2 is a schematic plane view showing portions of the die, the electronics package, and another apparatus according to a second example.

Via the electrical contacts 110A, 110B and 110C and the first plurality of electrical conductors 118A, 118B and 118C, the apparatus 100 can be positioned vertically below the electronics package 102 so as to interface with the major surface 132 as shown in FIG. 1. The capacitor 126 and/or parts of the inductor 122 (such as the inductor trace 124) within the apparatus 100 can be oriented to have major dimensions that are oriented to extend in a direction substantially parallel to (but spaced from) the major surface 132 of the electronics package 102. Furthermore, the capacitor 126 can be stacked vertically below (or above as shown in FIG. 2) the inductor 122 in the apparatus 100 so as to be substantially aligned in-plane (in the y-axis direction of the Cartesian coordinate system) therewith, according to the example provided in FIG. 1. Thus, the inductor 122 is positioned to be relatively nearer the electronics package 102 than the capacitor 126 in the example of FIG. 1.

The insulator 120 can be positioned between the magnetic material 123 and the capacitor 126, for example. The insulator 120 can also be positioned between the electrical conductor 118A and the inductor 122 and between the inductor 122 and the electronics package 102, for example. The magnetic material 123 can comprise a conductive layer deposited on the inductive trace 124. Although not shown there may be an insulator between inductor trace 124 & magnetic material 123. The insulator 120 can comprise an insulating material that can be deposited on the magnetic material 123. Many such insulating materials (e.g., dielectrics, plastics, ceramics, air, etc.) are known and can be selected as desired. For example, the insulator 120 can be glass-epoxy (e.g., FR-4, CEM-3, G-10, or other), Bismaleimide-Triazine epoxy, silica-filled epoxy, Cyanate Ester, Polyimide, Polytetrafluoroethylene (PTFE), Mylar (Biaxially-oriented polyethylene terephthalate), polyester film, polyethylene terephthalate (PET), beryllium oxide, aluminum, ceramic, porcelain, mica, glass, glass-cloth, prepreg, other metal oxides, other plastics, or the like.

The inductor 122 can comprise a magnetic inductor such as a multi-layer inductor, for example. In FIG. 1, only some of the layers (e.g., the magnetic material 123 and the inductor trace 124) are shown. The magnetic material 123 can comprise a ferrous material such as iron powder, manganese-zinc ferrite, molybdenum permalloy powder, nickel-zinc ferrite, sendust, silicon steel, or the like, for example. The magnetic material 123 can have a magnetic permeability of 3, 5, 100, 200, or the like. The inductor trace 124 can comprise an electrically conductive material (e.g., a metal or metal alloy such as nickel, lead brass, silver, copper, gold, tin, conductive ink, metal clad laminate, combinations thereof, or the like). According to one example, the inductor 122 can include a Quality Factor (Q-factor) of 5, 8, 10 or greater (at 100 MHz).

In some examples, the inductor 122 can comprise a Magnetic Core Inductor (MCI) filled with a material including magnetic particles suspended therein. The magnetic core can increase the inductance value of the inductor. In some examples, the MCI can include a magnetic core having a magnetic permeability including, 3, 5, 100, 200, or the like.

The capacitor 126 comprises a multi-layer ceramic capacitor (MLCC) according to the example of FIG. 1. The capacitor 126 is shown in FIG. 1 to include the first metalized end portion 127A, and additionally a second metalized end portion 127B opposing the first metalized end portion 127A and a body portion 127C positioned therebetween. The body portion 127C includes the multiple ceramic layers. The second metalized end portion 127B is electrically connected to the second electrical conductor 128 via connection 134B. The connection 134B can comprise a solder connection, for example.

Note that the layout shown in FIG. 1, particularly for the inductor 122 and capacitor 126 is merely exemplary. As is known by one skilled in the art, other layouts, designs or types of inductors can be utilized with the present apparatus 100. Thus, various designs for MCI, multi-layer, thin-film or ultra thin-film and on-chip inductors may be employed with the apparatus 100 as desired. Similarly, various designs for MLCC, silicon, thin-film or ultra thin-film and on-chip capacitors may be employed with the apparatus 100 as desired.

The second electrical conductor 128 can comprise a pillar 130D that has a major dimension that is oriented substantially (e.g., within 25 degrees) transverse of the major surface 132 of the electronics package 102. Thus, the second electrical conductor 128 (pillar 130D) is oriented to extend substantially vertically (here in the z-direction of the Cartesian coordinate system) along the major dimension from the connection 134B to the inductor 122. More particularly, the second electrical conductor 128 extends substantially vertically to electrically connect to a second end portion of the inductor 122 such as to the inductor trace 124. Thus, the second electrical conductor 128 is electrically connected to a voltage discharge end of the inductor 122 and electrical conductor 118B is electrically connected to a voltage input end of the inductor 122.

The inductor 122 and the capacitor 126 are arranged and electrically connected by the plurality of electrical conductors 118A, 118B and 118C and second electrical conductor 128 such that each of the inductor 122 comprise an output voltage filter inductor and the capacitor 126 comprises an output voltage filter capacitor. As shown in FIG. 1, the apparatus 100 is configured to operate as a buck converter to reduce a higher voltage to a lower voltage (output voltage from the apparatus 100 to the electronics package 102 and die 104). Such function is illustrated by exemplary electrical waveform 116C taken at the electrical contact 110C, for example. This waveform 116C exhibits a lower average amplitude voltage (e.g., 1V) as compared with the amplitude of the voltages shown in waveform 116B. The voltage variation of 116C is substantially lower (e.g., 25 mV) than that of waveform 116B (e.g., 1.8V). More particularly, the inductor 122 is configured and electrically connected to realize the output filter inductor of the buck converter while the capacitor 126 is configured and electrically connected to realize an output filter capacitor and augments on-die filter capacitance.

As ESL (e.g., one 0204 1uF has 80 pH) of ceramic capacitors such as the capacitor 126 is comparable to the package connection inductance from the inductor to the die capacitance, the present capacitor's 126 effectiveness is similar to the on die-capacitance for both output voltage ripple mitigation and output transients. As processes shrink (leading to per domain on-die capacitance reduction) and transient currents increase, the additional capacitance provide by the present apparatus 100 becomes valuable for mitigating total voltage noise.

FIGS. 2-7 show various other apparatuses that are configured differently from apparatus 100 to address different converter topologies and/or volume constraints. For example, the plurality of electrical conductors and the second electrical conductor and arrangement of other components such as the capacitor(s) and inductor(s) can be varied by one or more of a position, circuit type and number to suit different dc-dc power converter topologies.

FIG. 2 shows another exemplary apparatus 200 that can be used with the electronics package 102 and die 104 as previously described to operate as a buck converter to reduce a higher voltage (the input voltage to the apparatus 100) to a lower voltage (output voltage from the apparatus 100 to the electronics package 102 and die 104).

Apparatus 200 includes the first plurality of electrical conductors 118A, 118B and 118C, the insulator 120, the inductor 122, the capacitor 126 and the second electrical conductor 128 as previously described. Thus, the inductor 122 includes the magnetic material 123 and the inductor trace 124.

However, the electrical conductors 118A, 118B and 118C, the inductor 122, the capacitor 126 and the second electrical conductor 128 are disposed in different locations relative to one another and the electronics package 102 in the apparatus 200 of FIG. 2 as compared to the apparatus 100 of FIG. 1. Both the apparatus 200 and the apparatus 100 include the inductor 122 is vertically stacked with the capacitor 126 so as to be directly disposed above or below (i.e. aligned in the y-axis direction of the Cartesian coordinate system) the inductor 122. However, the apparatus 200 has a configuration which disposes the capacitor 126 relatively above the inductor 122 relatively closer to the electronics package 102. Such a configuration may be useful as the capacitor 126 may be more readily available for use in additional ripple mitigation. Additionally, by disposing the capacitor 126 closer to the electronics package 102, the length of the loop created by the capacitor 126 (and including the electrical conductor 118A and the second electrical conductor 128) is reduced resulting in reduced parasitic inductance.

Figure 3:
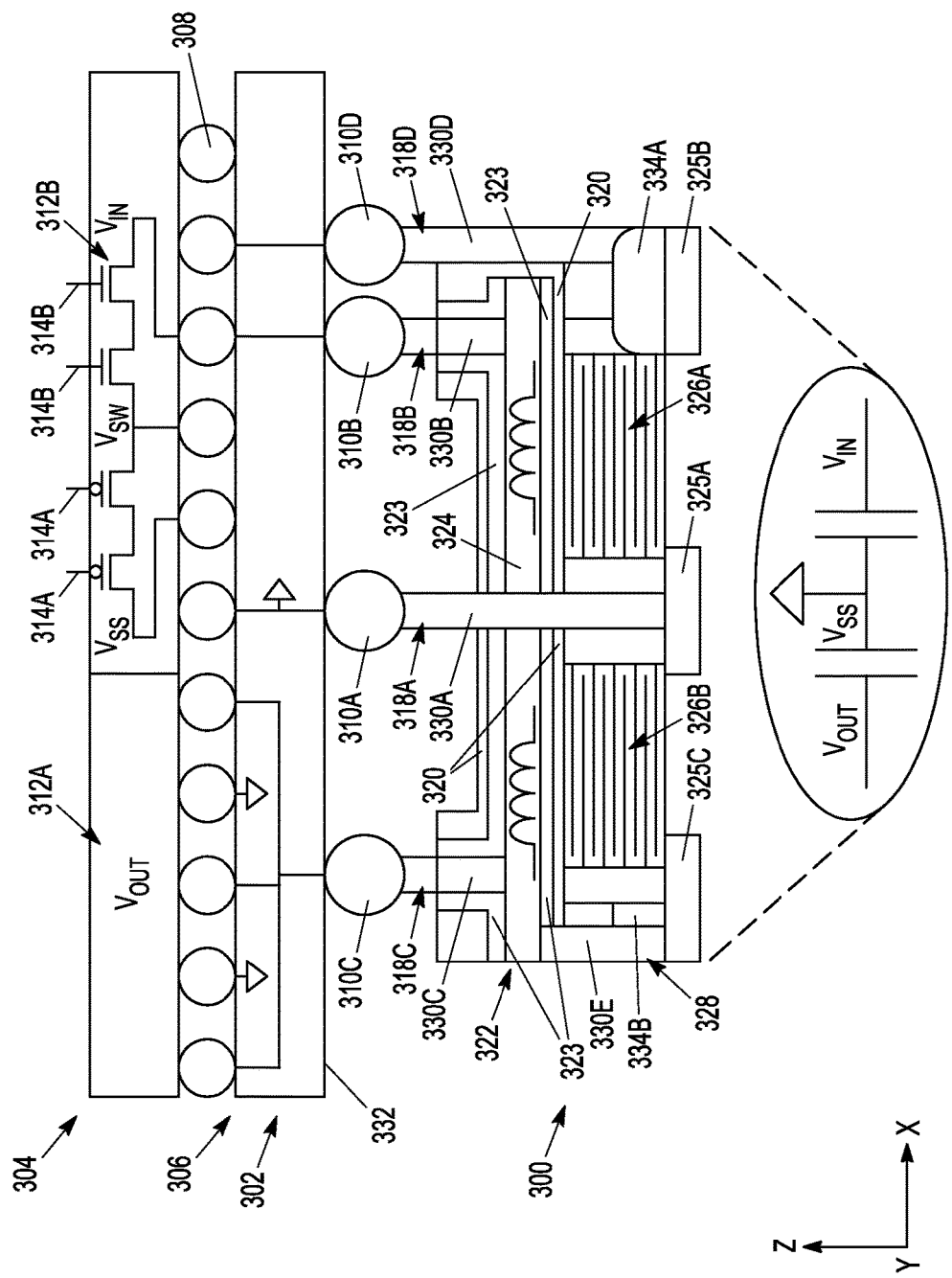
FIG. 3 is a schematic plane view showing portions of a second die, a second electronics package and a third apparatus according to a third example.
Figure 4:
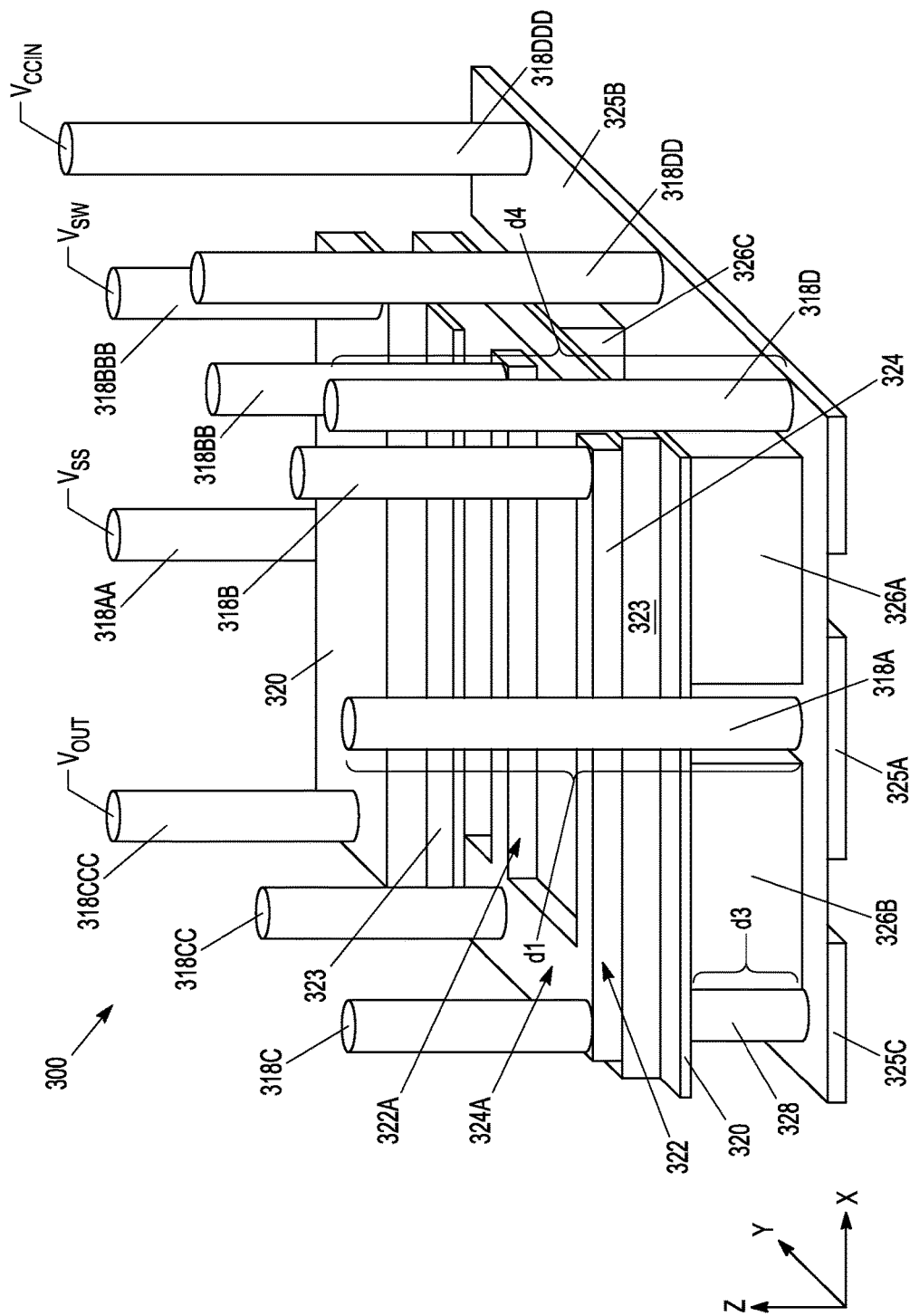
FIG. 4 is a perspective view of the third apparatus of FIG. 3.

FIGS. 3 and 4 show an apparatus 300. FIG. 3 shows a plane view of a portion of the apparatus 300 and additionally shows an electronics package 302 and a die 304. The portion of the electronics package 302 switches 314A and 314B shown can comprise a VR 306 according to the example of FIG. 3.

In an example, the die 304 can be fabricated from a silicon wafer, gallium arsenide, or other semiconductor. The die 304 can include, but is not limited to, circuit(s), a processor, microprocessor, random access memory, radio, arithmetic unit, any combination thereof, or the like. It should be noted that the electronics package 302, die 304 and portions of the apparatus 300 are shown in a schematic manner in FIG. 3 to aid the interpretation of the reader by eliminating undesired detail.

As shown in FIG. 3, the apparatus 300 is arranged with the electronics package 302 in both an output voltage filter configuration and an input voltage filter configuration. As shown in the example of FIG. 3, the die 304 can be positioned above and electrically connected to the electronics package 302 such as by electrical contacts 308 (e.g., die bumps) or another type of electrical contacts. The electronics package 302, here the IVR 306, can be electrically connected to the apparatus 300 via electrical contacts 310A, 310B, 310C and 310D. Such electrical contacts 310A, 310B, 310C and 310D are each illustrated as a Ball Grid Array (BGA) however, the electrical contacts 310A, 310B, 310C and 310D can comprise any of BGAs, Land Grid Arrays (LGAs), Pin Grid Arrays (PGAs), surface mounts, through-holes, or the like, for example.

In the example of FIG. 3, the die 304 includes circuits 312A and 312B, such as integrated circuits. The circuit 312A carries an output voltage (Vout) from the apparatus 300 and the electronics package 302. The circuit 312B carries an input voltage (difference between Vin and Vss) to the apparatus 300. The circuit 312B includes switches 314A and 314 B that can be opened and closed to modulate the input voltage to the apparatus 300, and hence, the output voltage from the apparatus 300. In FIG. 3, the apparatus 300 is configured as a buck converter for the input voltage so as to reduce the amplitude of the input voltage of the VR 306 (i.e. the amplitude of the voltage taken at contact 310A is reduced relative to the amplitude of the voltage taken at 310D). Similarly, the apparatus 300 is also configured as a buck converter for the output voltage so as to reduce the amplitude of the output voltage of the VR 306 (i.e. the average amplitude of the voltage taken at contact 310B is reduced relative to the amplitude of the voltage taken at 310D).

In the example of FIG. 3, the apparatus 300 includes, a first plurality of electrical conductors 318A, 318B, 318C and 318D, an insulator 320, an inductor 322, a first capacitor 326A, a second capacitor 326B and a second electrical conductor 328. The inductor 322 includes a magnetic material 323 and an inductor trace 324. The apparatus 300 further includes short traces 325A, 325B and 325C.

As shown in FIG. 3, the first plurality of electrical conductors 318A, 318B, 318C and 318D are coupled to the electrical contacts 310A, 310B, 310C and 310D, respectively to facilitate electrical connection therebetween. Each of the first plurality of electrical conductors 318A, 318B, 318C and 318D comprise a pillar 330A, 330B, 330C and 330D (e.g., a trace formed of an electrically conductive material (e.g., a metal or metal alloy such as nickel, lead brass, silver, copper, gold, tin, conductive ink, metal clad laminate, combinations thereof, or the like)).

Each pillar 330A, 330B, 330C and 330D is oriented to extend substantially vertically (here in the z-direction of the Cartesian coordinate system) along a major dimension from the electrical contacts 310A, 310B, 310C and 310D. Thus, the pillars 330A, 330B, 330C and 330D have the major dimension that is oriented substantially (e.g., within about 25 degrees) transverse of the major surface 332 of the electronics package 302. Here the major surface 332 of the electronics package 302 is shown to extend in both the x-direction and y-direction of the Cartesian coordinate system provided.

The electrical conductor 318A is coupled to electrical contact 310A and extends substantially vertically to electrically connect to the short trace 325A. The electrical conductor 318D is coupled to the electrical contact 310D and extends substantially vertically to electrically connect to the short trace 325B. The short trace 325B can be electrically connected to a first end of the first capacitor 326A such as via connection 334A. The connection 334A can comprise a solder connection for example. A second end of the first capacitor 326A can be electrically connected to the short trace 325A. The electrical conductor 318B is coupled to electrical contact 310B and extends substantially vertically to electrically connect to a first end portion of the inductor 322 such as to the inductor trace 324. The electrical conductor 318C is coupled to electrical contact 310C and extends substantially vertically to electrically connect to a second end portion of the inductor 322 such as to the inductor trace 324.

Via the electrical contacts 310A, 310B, 310C and 310D and the first plurality of electrical conductors 318A, 318B, 318C and 318D, the apparatus 300 can be positioned vertically below the electronics package 102 so as to interface with the major surface 332 as shown in FIG. 3. The first capacitor 326A, the second capacitor 326B and/or parts of the inductor 322 such as the inductor trace 324 within the apparatus 300 can be oriented to have major dimensions that are oriented to extend in a direction substantially parallel to (but spaced from) the major surface 332 and the electronics package 302. Furthermore, the first and second capacitors 326A and 326B can be disposed below (or above as shown in FIG. 2) the inductor 322 in the apparatus 300, according to the example provided in FIG. 3. Thus, the inductor 322 is positioned be relatively nearer the electronics package 302 than the first and second capacitors 326A and 326B in the example of FIG. 3. However, as shown in FIG. 4, the first and second capacitors 326A and 326B need not be vertically stacked so as to be directly disposed above or below (i.e. aligned in the y-axis direction of the Cartesian coordinate system) the inductor 322. Rather, the first and second capacitors 326A and 326B can be offset in-plane (e.g., in the y-axis direction of the Cartesian coordinate system) from the inductor 322. However, the first and second capacitors 326A and 326B are disposed below the inductor 322 in the apparatus 300, according to the example provided in FIG. 3. According to further examples, one of the first and second capacitors 326A and 326B could be disposed above the inductor 322 while the other of the first and second capacitors 326A and 326B could be disposed below the inductor 322. Thus, all the capacitors need not be disposed in the same relative vertical position (z-axis coordinate position) with one another in all examples. As the example of FIG. 4 introduces several groups each comprised of a plurality of capacitors, it is contemplated in some examples that a plurality of capacitors (e.g., one of the groups of capacitors) can be positioned vertically above the inductor 322 and a plurality of capacitors (e.g., another of the groups of capacitors) can be disposed vertically below the inductor 322.

The insulator 320 can be positioned between the magnetic material 323 and the first and second capacitors 326A and 326B, for example. The insulator 320 can also be positioned between the electrical conductor 118A and the inductor 322 and between the inductor 322 and the electronics package 302, for example. The insulator 320 can comprise an insulating material(s) as previously described with respect to insulator 120. The inductor 322 can comprise a magnetic inductor such as the MLCC, MCI, thin-film or ultra thin-film and on-chip inductor as previously described. Similarly, the first and second capacitors 326A and 326B each comprise MLCC according to the example of FIG. 3. However, various designs for MLCC, silicon, thin-film or ultra thin-film and on-chip capacitors may be employed with the apparatus 100 as desired.

The second capacitor 326B is shown in FIG. 3 is electrically connected at a first end to the short trace 325A. The second capacitor 326B is electrically connected at a second end to the short trace 325C and the second electrical conductor 328 via connection 334B. The connection 334B can comprise a solder connection, for example.

The second electrical conductor 328 can comprise a pillar 330E that has a major dimension that is oriented substantially (e.g., within 25 degrees) transverse of the major surface 332 of the electronics package 302. Thus, the second electrical conductor 328 (pillar 330E) is oriented to extend substantially vertically (here in the z-direction of the Cartesian coordinate system) along the major dimension from the short trace 325C to the inductor 322. More particularly, the second electrical conductor 328 extends substantially vertically to electrically connect to a second end portion of the inductor 322 such as to the inductor trace 324.

The inductor 322 and the first and second capacitors 326A and 326B are arranged and electrically connected by the plurality of electrical conductors 318A, 318B, 318C and 318D and the second electrical conductor 328 such that the first and second capacitors 326A and 326B are separated into a first group (includes the second capacitor 326B) that comprise output voltage filter capacitors and a second group that comprise input voltage filter capacitors (includes the capacitor 326A). As shown in FIG. 3, the second capacitor 326B is electrically connected to provide the output voltage of the VR 306 while the first capacitor 326A is electrically connected to the input voltage of the VR 306. The capacitance provided by the first capacitor 326A can be important for mitigating mid-frequency (e.g. 1-50 MHz) noise. However, unlike currently solutions for providing such capacitance, which consume a large portion of the area on the land side of the package, the present apparatus 300 provides such capacitance without consuming such large portion of the area as the apparatus 300 is positioned vertically above or below the electronics package 302. Such additional capacitance can be used to either reduce such mid-frequency noise or can be used to free up area on the electronics package (e.g., on the bottom layer) for power routing and can reduce low frequency impedance.

FIG. 4 shows the apparatus 300 from a perspective view including the first plurality of electrical conductors 318A, 318B, 318C and 318D, the insulator 320, the inductor 322, the first capacitor 326A, the second capacitor 326B and the second electrical conductor 328. The inductor 322 includes the magnetic material 323 and the inductor trace 324 as previously described in FIG. 3. The apparatus 300 further includes the short traces 325A, 325B and 325C as previously described in FIG. 3.

As FIG. 4 shows the entirety of the apparatus 300, further details of the construction of the apparatus 300 are provided. In particular, each of the electrical conductors 318A, 318B, 318C and 318D can be part of groups of multiple electrical conductors to facilitate electrical connection to different electronics package configurations. Additionally, the inductor 322 can be one of a plurality of several conductors of the apparatus 300 including inductor 322A and a third inductor (not shown—covered by the top portions of the insulator 320 and magnetic material 323). The first and second capacitors 326A and 326B can be part of a plurality of capacitors that include a third capacitor 326C and a fourth capacitor (not shown—covered by the bottom portions of the insulator 320 and magnetic material 323).

In view of the foregoing, the electrical conductor 318A can be part of a group that further includes electrical conductor 318AA, for example. Both the electrical conductor 318A and electrical conductor 318AA can be commonly electrically connected to the short trace 325A. The short trace 325A can extend across the apparatus 300 and can be oriented substantially transverse to a major dimension dl of the electrical conductor 318A (which is oriented and extends substantially vertically as shown in FIG. 4).

The electrical conductor 318D can be part of a group that further includes electrical conductors 318DD and 318DDD. Both the electrical conductor 318D and electrical conductors 318DD and 318DDD can be commonly electrically connected to the short trace 325B. The short trace 325B can extend across the apparatus 300 in-plane and can be oriented substantially transverse to a major dimension d4 of the electrical conductor 318D (which extends substantially vertically as shown in FIG. 4).

Electrical conductor 318B can be part of a group that further includes electrical conductors 318BB and 318BBB that are each connected to an end of the respective inductor 322, 322A and the third inductor (not shown) at the inductive trace 324. Additionally, the electrical conductor 318C can be part of a group that further includes electrical conductors 318CC and 318CCC. Inductors 322, 322A and the third inductor can have the inductive trace 324 shorted together by a cross-apparatus trace 324A at a second end and this cross-apparatus trace 324A can be electrically connected to the electrical conductors 318C, 318CC and 318CCC.

In some cases, the second electrical conductor 328 can be electrically connected to the cross-apparatus trace 324A and can extend substantially vertically to be electrically connected to the short trace 325C. The short trace 325C can extend across the apparatus 300 in-plane and can be oriented substantially transverse to the major dimension d3 of the second electrical conductor 328 (which is oriented and extends substantially vertically as shown in FIG. 4).

Although not shown in the example of FIG. 4, in some examples, the second electrical conductor 328 can be part of a plurality of electrical conductors rather than the single conductor illustrated.

Figure 5:
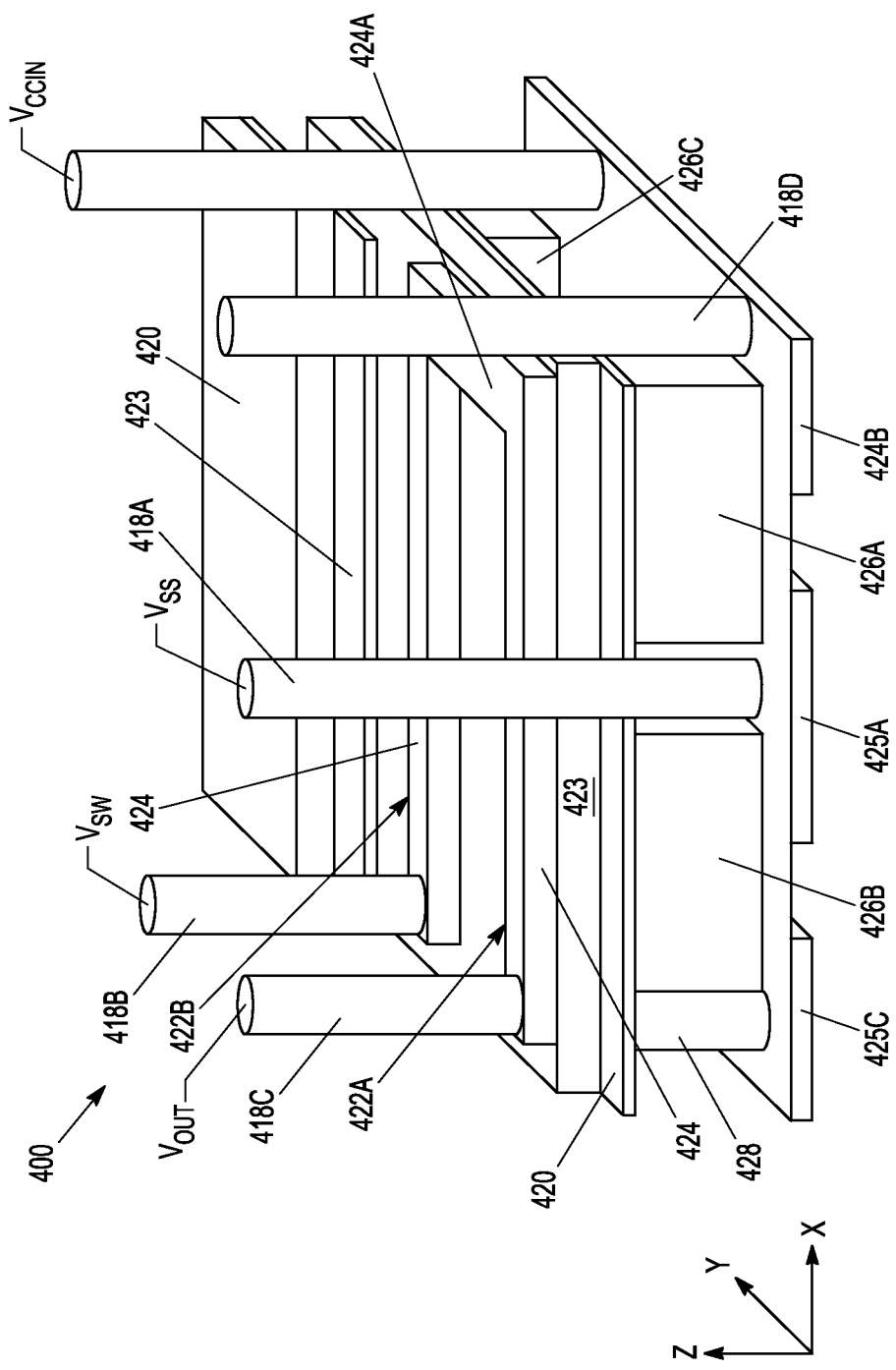
FIG. 5 is a perspective view of a fourth apparatus according to a fourth example.

FIG. 5 shows another apparatus 400 having a configuration that is modified slightly to differ from that of the apparatus 300. However, the apparatus 400 is configured for both an output voltage filtering and an input voltage filtering. In particular, the apparatus 400 is varied from that of apparatus 300 to create a series of interconnected inductors 422A and 422B. This construct can provide a higher inductance for the apparatus 400 due to the series connection of the inductors 422A and 422B. The inductors 422A and 422B can be electrically connected in series by a cross trace 424A as shown. The apparatus 400 also includes a first plurality of electrical conductors 418A, 418B, 418C and 418D, an insulator 420, a first capacitor 426A, a second capacitor 426B, a third capacitor 426C, a fourth capacitor (not shown) and a second electrical conductor 428 constructed in a manner similar to those previously described in reference to FIGS. 3 and 4. Thus, the inductors 422A and 422B each include the magnetic material 423 and the inductor trace 424 as previously described in FIGS. 3 and 4. The apparatus 400 further includes short traces 425A, 425B and 425C constructed in the manner of short traces 325A, 325B and 325C described previously.

It should be noted that with the configuration of the apparatus 400, the relative position of one or more of the first plurality of electrical conductors 418A, 418B, 418C and 418D can be altered relative to those of the first plurality of electrical conductors 318A, 318B, 318C and 318D of the apparatus 300. For example, the electrical conductor 418B is now positioned more closely adjacent the electrical conductor 418C adjacent the left-most side of the apparatus 400. This alteration can be used to address volume constraints or alternative electronics package configurations, for example.

Figure 6:
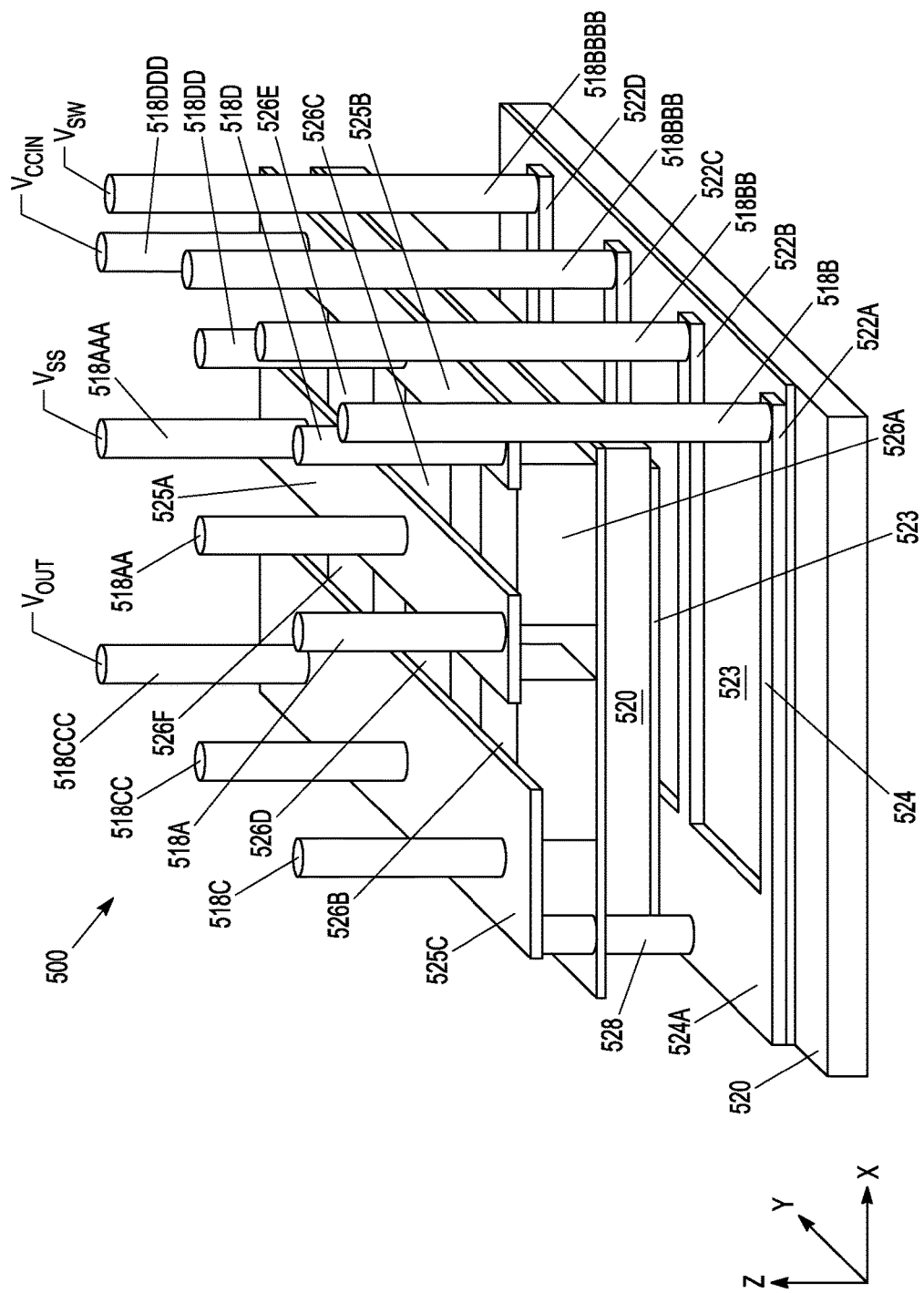
FIG. 6 is a perspective view of a fifth apparatus according to a fifth example.

FIG. 6 shows another apparatus 500 having a configuration that is modified to differ from that of apparatus 300. However, the apparatus 500 is configured for both an output voltage filtering and an input voltage filtering. Thus, the apparatus 500 can operate as either a boost converter or a buck converter, for example. In particular, the apparatus 500 is varied from that of apparatus 300 to dispose the capacitors 526A, 526B, 526C, 526D, 526E and 526F relatively nearer the electronics package than the inductors 522A, 522B, 522C and 522D. This construction may be useful as the capacitors 526A, 526B, 526C, 526D, 526E and 526F may be more readily available for use in additional ripple mitigation. Additionally, by disposing the capacitors 526A, 526B, 526C, 526D, 526E and 526F relatively closer to the electronics package than the inductors 522A, 522B, 522C and 522D, the length of the loop created by the capacitors 526A, 526B, 526C, 526D, 526E and 526F and their electrical connections is reduced resulting in reduced parasitic inductance.

The apparatus 500 includes a first plurality of electrical conductors 518A, 518B, 518C and 518D, an insulator 520, the inductors 522A, 522B, 522C and 522D, capacitors 526A, 526B, 526C, 526D, 526E and 526F and a second electrical conductor 528 constructed in a manner similar to those previously described in reference to FIGS. 3 and 4. Thus, the inductors 522A, 522B, 522C and 522D each include magnetic material 523 and the inductor trace 524 as previously described in FIGS. 3-5. The apparatus 500 further includes short traces 525A, 525B and 525C constructed in the manner of short traces described previously.

In the example of FIG. 6, the inductors 522A, 522B, 522C and 522D can be electrically connected to a cross trace 524A as shown. Similar to the embodiment of FIG. 4, the apparatus 500 includes groups to which electrical conductors 518A, 518B, 518C and 518D belong. For example, the electrical conductor 518A can be part of a group that further includes electrical conductors 518AA and 518AAA, for example. Both the electrical conductor 518A and electrical conductors 518AA and 518AAA can be commonly electrically connected to the short trace 525A. The short trace 525A can extend across the apparatus 500 in-plane and can be oriented substantially transverse to a major dimension (refer to FIG. 4 for reference number) of the electrical conductor 518A (which is oriented and extends substantially vertically as shown in FIG. 6).

Similarly, the electrical conductor 518D can be part of a group that further includes electrical conductors 518DD and 518DDD. Both the electrical conductor 518D and electrical conductors 518DD and 518DDD can be commonly electrically connected to the short trace 525B. The short trace 525B can extend across the apparatus 500 in-plane and can be oriented substantially transverse to a major dimension (refer to FIG. 4 for reference number) of the electrical conductor 518D (which extends substantially vertically as shown in FIG. 6).

Electrical conductor 518B can be part of a group that further includes electrical conductors 518BB, 518BBB and 518BBBB that are each connected to a first end of the respective inductor 522A, 522B, 522C and 522D at the inductive trace 524.

Additionally, the electrical conductor 518C can be part of a group that further includes electrical conductors 518CC and 518CCC that are electrically connected to short trace 525C. The second electrical conductor 528 can be electrically connected to the short trace 525C and can extend substantially vertically to be electrically connected to the cross-apparatus trace 524A. The short trace 525C can extend across the apparatus 500 in-plane and can be oriented substantially transverse to the major dimension (refer to FIG. 4 for reference number) of the second electrical conductor 528 (which is oriented and extends substantially vertically as shown in FIG. 6). Although not shown in the example of FIG. 6, in some examples, the second electrical conductor 528 can be part of a plurality of electrical conductors rather than the single conductor illustrated.

The inductors 522A, 522B, 522C and 522D can have the inductive trace 524 shorted together by the cross-apparatus trace 524A at a second end and this cross-apparatus trace 524A can be electrically connected to the second electrical conductor 528. Such configuration for the apparatus 500 differs from that of the apparatus 300 of FIG. 4 where the electrical conductors 318C, 318CC and 318CCC are electrically connected to the cross-apparatus trace 324A. This alteration can be used to address volume constraints or alternative electronics package configurations, for example.

Figure 7:
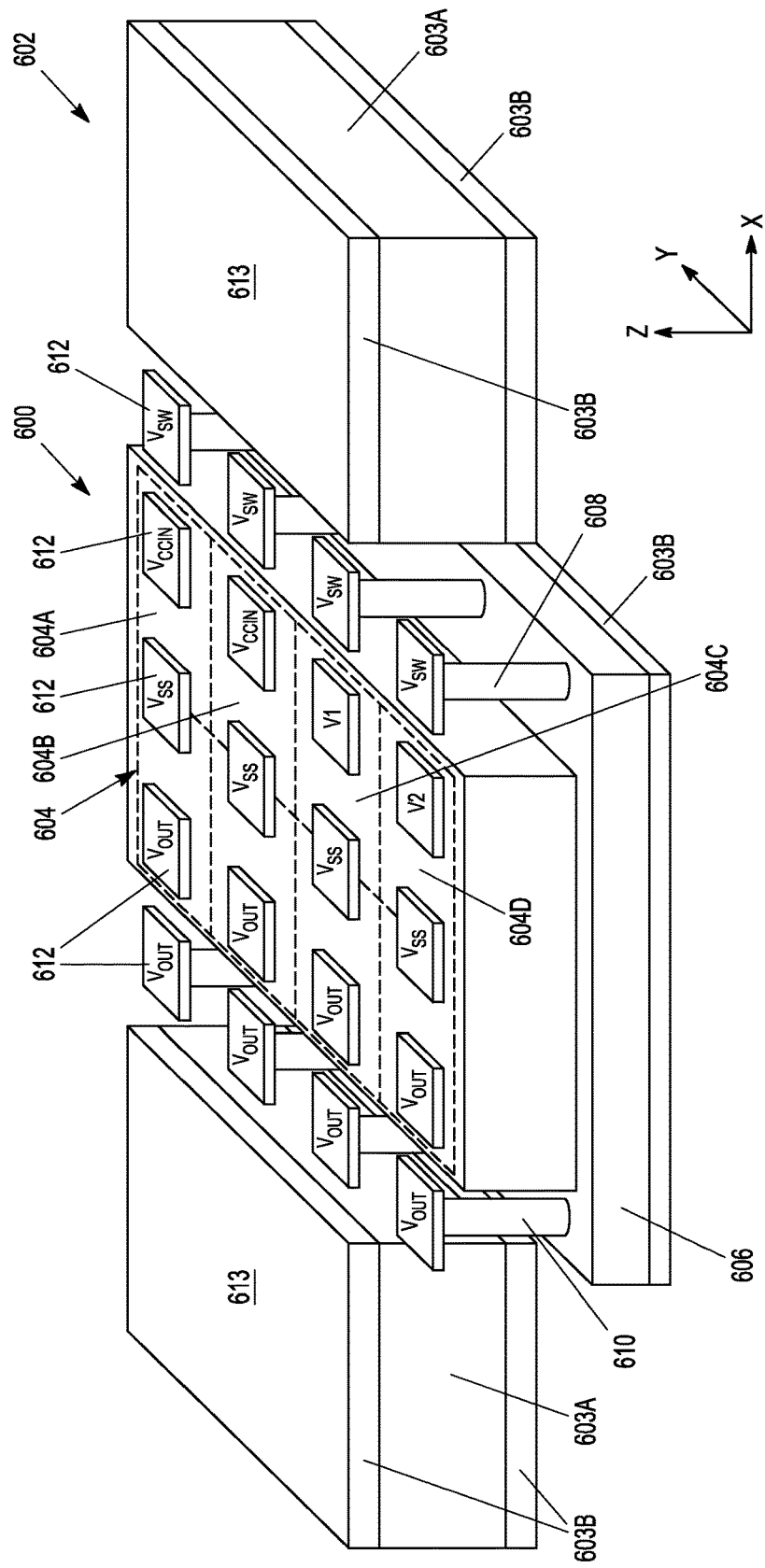
FIG. 7 is a perspective view of a sixth apparatus utilizing an interdigitated capacitor array embedded in a package core of an electronics package according to a sixth example.

FIG. 7 shows another exemplary apparatus 600 where the apparatus 600 is integrated into the electronics package 602. In particular, the apparatus 600 can be embedded in a package core 603A of the electronics package 602 below and above a package buildup layer 603B. Such an arrangement can facilitate lower connection inductance, facilitate multiple rail decoupling and remove the need for a package cavity on the bottom side of the package (thus resulting in a smaller package form factor). The apparatus 600 can include an interdigitated capacitor array 604 (IDC) that is positioned vertically above one or more inductors 606 and is embedded in the package core 603A. The one or more inductors 606 at a first end can be connected to the switched voltage Vsw by pillars 608 that extend through the package core 603A, for example. The one or more inductors 606 at a second end can be connected to the output voltage by pillars 610, for example. The pillars 608 and 610 can be constructed in the manner previously described and can be oriented to extend substantially vertically relative to a major surface 613 of the electronics package 602. In some cases, the one or more inductors 606 can also be embedded in the package core 603A.

The IDC 604 can comprise a commercially available product such as LLA215C70G473MA17FB01 from Murata.

Additionally, the apparatus 600 can include a plurality contacts 612 (e.g., pads) connected to the IDC 604 or the pillars 608A, 608B, 608C, 608D, 610A, 610B, 610C and 610D, respectively in desired groups. These contacts 612 can be disposed at the major surface 613 of the electronics package 602 for electrical connection to a die or other component. In some cases, the contacts 612 can be partially embedded in the package buildup layer 603B for electrical connection to planes on the package.

As shown in FIG. 7, one or more of the capacitors in the IDC 604 as well as the one or more inductors 606 can be used to filter one or more output voltages to the electronics package 602. One or more of the capacitors 604A and 604B in the IDC 604 can also be used to filter one or more input voltages as desired. Additionally, one or more capacitors 604C and 604D in the IDC 604 can be used to filter the input voltage to differing voltage levels (indicated as V1 and V2) if desired such as for other power rails. Thus, the apparatus 600 can be configured as one or both of a buck converter and a boost converter among other functions.

Figure 8:
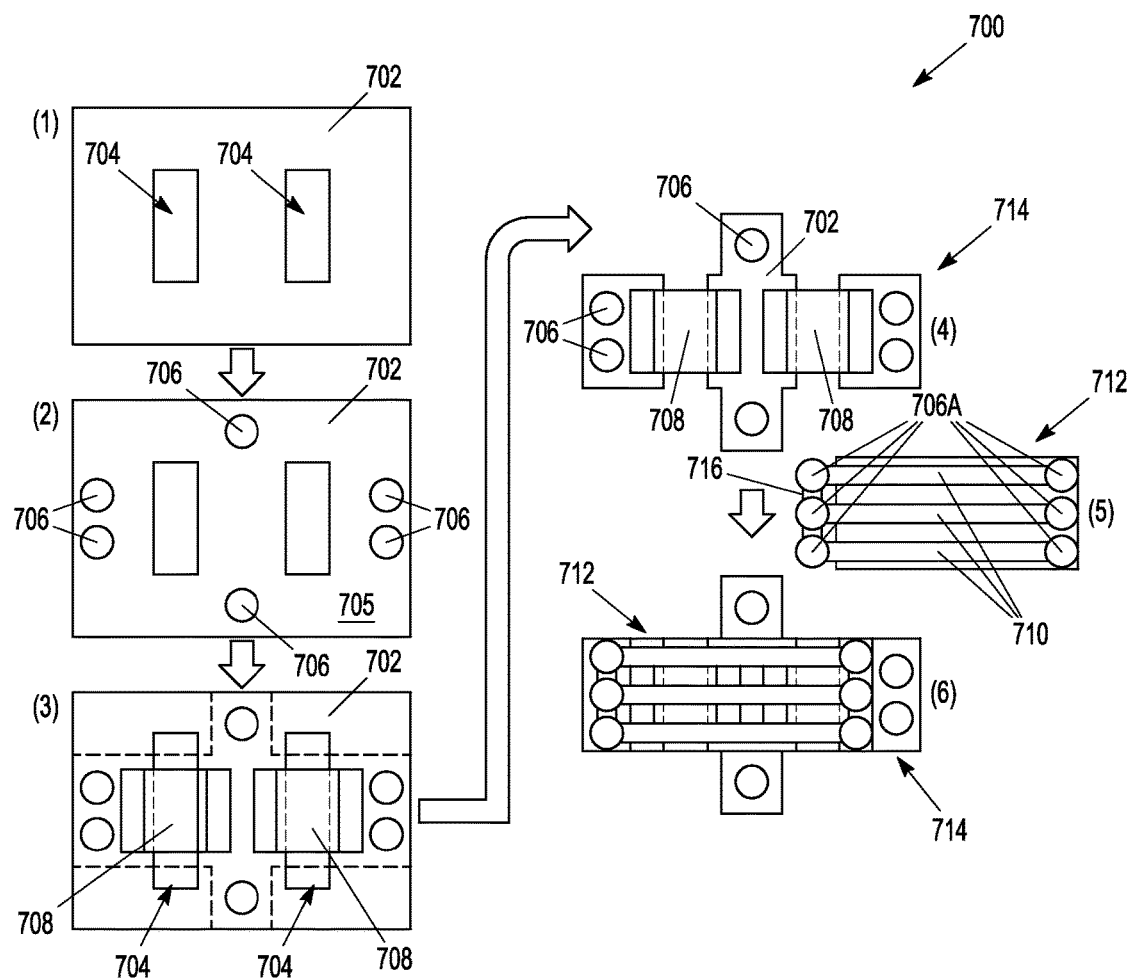
FIG. 8 is a diagram of an exemplary method of making one of the apparatuses such as one of those provided according to examples one to five.

FIG. 8 shows a method 700 of fabricating an apparatus similar to those previously shown and described in FIGS. 1-6. As illustrated in FIG. 8, the method 700 can utilize a sheet 702 formed of an electrically conductive material (e.g., a metal or metal alloy such as nickel, lead brass, silver, copper, gold, tin, conductive ink, combinations thereof, or the like). The sheet 702 can be stamped in some cases to form one or more windows 704 therein. As shown in step (2) of FIG. 8, a plurality of pillars 706 (e.g., some of the first plurality of electrical conductors and the second electrical conductor(s)) can be attached to the sheet 702 for electrical connection therewith. The pillars 706 can comprise an electrically conductive material (e.g., a metal or metal alloy such as nickel, lead brass, silver, copper, gold, tin, conductive ink, combinations thereof, or the like). The pillars 706 can be attached to the sheet 702 for electrical connection by conductive ink, leaded solder (tin/lead) or lead free solder (tin/copper), for example. The pillars 706 are oriented substantially vertically from a major surface (705 in step (2)) of the sheet 702 and extend away therefrom. Additionally the pillars 706 can extend substantially vertically to electrically connect the one or more magnetic inductors and the one or more capacitors to the electronics package and the one or more magnetic inductors as will be described and shown subsequently.

As shown in step (3), the one or more capacitors 708 are attached to the sheet 702 to form an electrical connection therewith. This attachment can be by conductive ink, leaded solder (tin/lead) or lead free solder (tin/copper), for example. The one or more capacitors 708 can be positioned to extend across the windows 704. In step (4), portions of the sheet 702 are removed as desired. This, in combination with the windows 704 (steps (1)-(3)), creates desired electrical isolation of portions of the sheet 702 from one another. These electrically isolated portions form the short traces as previously illustrated and described.

Illustrated at step (5), the method 700 provides one or more inductors 710 as previously described and illustrated. However, the one or more inductors can be provided at any prior step in the method 700. The one or more inductors 710 can be part of an assembly 712 that further includes cross traces and further pillars 706A (e.g., further of the first plurality of electrical conductors) as previously illustrated and described, for example. At step (6), an assembly 714 (shown full detail in step 4) of the one or more capacitors 708, the sheet 702 (now comprised of electrically isolated portions) and the pillars 706 is attached to one of a top or bottom of the one or more inductors 710. Such attachment can facilitate an electrical connection as well as a mechanical connection. Thus, the attachment can be by conductive ink, leaded solder (tin/lead) or lead free solder (tin/copper), for example. In particular, as shown in step (6), the assembly 714 of the one or more capacitors 708, the sheet 702 and the pillars 706 is attached to a bottom of the assembly 712 via some of the pillars 706, which are attached for electrical connection to a cross-trace 716 of the assembly 712. According to further steps not specially shown, insulator can be positioned between the assembly 712 and the assembly 714 and around portions of the one or more inductors 710.

Locating the apparatuses such as those disclosed above or below the electronics package, can among other things, improve the power efficiency, facilitate higher data transfer rates and performance gain, reduce the electronics package size (form factor), reduce the cost of electronics package design, mitigate voltage ripple of the electronics package, reduce jitter, provide input and/or output voltage capacitance, or any combination thereof.

Figure 9:
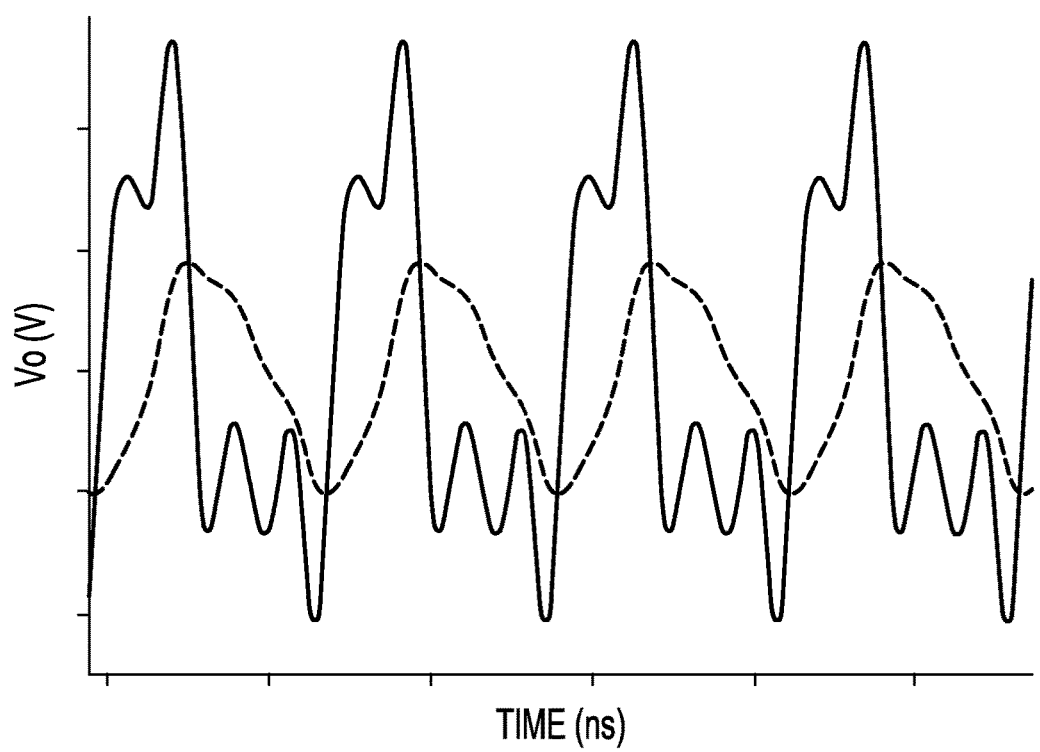
FIG. 9 is a graph that shows voltage ripple reduction by use of the apparatus of example three.

FIG. 9 shows voltage ripple reduction by use of the apparatus 300 of FIGS. 3 and 4. As shown in FIG. 9, inclusion of the apparatus 300 reduces the amplitude of the input voltage of the VR by 60%. This 60% lower ripple can be used to reduce voltage guard band or allow for lower inductance designs that will have superior transient performance. Voltage ripple reduction is particularly important for high speed input/output (I/O).

Examples of an electronic device (e.g., electronic system) using the apparatuses and/or the electronics packages as described in the present disclosure include, but are not limited to personal computers, tablet computers, mobile telephones, game devices, MP3 or other digital music players, data processing systems, etc. Such electronic device/system(s) can include a processor. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Each of these non-limiting examples can stand on its own, or can be combined in various permutations or combinations with one or more of the other examples. To better illustrate the method and apparatuses disclosed herein, a non-limiting list of embodiments is provided here:

Example 1 is an apparatus for an electronics package that can optionally comprise any one or any combination of: one or more magnetic inductors; one or more capacitors positioned one of above or below to the one or more magnetic inductors and insulated therefrom; a plurality of electrical conductors comprising pillars that extend substantially vertically to electrically connect the one or more magnetic inductors and the one or more capacitors to the electronics package and the one or more magnetic inductors, the one or more capacitors and the plurality of conductors are disposed one of above or below the electronics package; and at least one electrical conductor comprising a pillar extending substantially vertically to electrically connect the one or more magnetic inductors and the one or more capacitors.

In Example 2, the subject matter of Example 1 optionally includes wherein the least one electrical conductor is electrically connected to a voltage discharge end of the one or more magnetic inductors.

In Example 3, the subject matter of any one or more of Examples 1-2 optionally include wherein at least one of the plurality of electrical conductors is electrically connected to a voltage input end of the one or more magnetic inductors.

In Example 4, the subject matter of any one or more of Examples 1-3 optionally include wherein the one or more magnetic inductors and the one or more capacitors are arranged and electrically connected by the plurality of electrical conductors and the at least one electrical conductor such that each of the one or more magnetic inductors comprise an output voltage filter inductor and each of the one or more capacitors comprise an output voltage filter capacitor.

In Example 5, the subject matter of any one or more of Examples 1-4 optionally include wherein the one or more magnetic inductors and the one or more capacitors are arranged and electrically connected by the plurality of electrical conductors and the at least one electrical conductor such that the one or more capacitors are separated into a first group that comprise output voltage filter capacitors and a second group that comprise input voltage filter capacitors.

In Example 6, the subject matter of any one or more of Examples 1-5 optionally include wherein one or more of the plurality of electrical conductors and the least one electrical conductor are varied by one or more of a position, circuit type and number to suit different dc-dc power converter topologies.

In Example 7, the subject matter of any one or more of Examples 1-6 optionally include wherein the one or more capacitors are positioned one of relatively closer to or relatively further from the electronics package than the one or more magnetic inductors.

In Example 8, the subject matter of any one or more of Examples 1-7 optionally include wherein the one or more capacitors are arranged relative to the one or more inductors to create one of: an assembly with the one or more capacitors vertically stacked so as to be disposed directly above or below the one or more magnetic inductors or an assembly with the one or more capacitors are offset from the one or more inductors along a major surface of the electronics package.

In Example 9, the subject matter of any one or more of Examples 1-8 optionally include wherein the electronics package comprises a voltage regulator along with at least one or more inductors, one or more capacitors and active circuit components such as semiconductor switches.

In Example 10, the subject matter of any one or more of Examples 1-9 optionally include wherein the apparatus is configured as one or both of a buck converter circuit and a boost converter circuit.

Example 11 is an apparatus for an electronics package that can optionally include any one or any combination of: one or more magnetic inductors; a capacitor array positioned above the one or more magnetic inductors and insulated therefrom; and a plurality of electrical conductors that electrically connect the one or more magnetic inductors and the capacitor array to the electronics package; wherein the capacitor array is embedded in a package core of the electronics package.

In Example 12, the subject matter of Example 11 optionally includes wherein at least some or all of the plurality of electrical conductors comprise pads exposed at a top surface thereof and positioned at a package build up layer of the electronics package.

In Example 13, the subject matter of any one or more of Examples 11-12 optionally include wherein one or more capacitors of the capacitor array are electrically connected by one or more of the plurality of electrical conductors to the electronics package to provide filtering for one or more voltage outputs, one or more voltage inputs, or other power rails of the electronics package.

In Example 14, the subject matter of any one or more of Examples 11-13 optionally include wherein the one or more magnetic inductors are embedded in the package core layer.

In Example 15, the subject matter of any one or more of Examples 11-14 optionally include wherein the apparatus is configured as one or both of a buck converter circuit and a boost converter circuit.

In Example 16, the subject matter of any one or more of Examples 11-15 optionally include wherein the capacitor array comprises an interdigitated capacitor array.

Example 17 is a method of fabricating an apparatus for coupling with an electronics package, the method comprising: providing one or more inductors; attaching a plurality pillars to an electrically conductive sheet, wherein the pillars are oriented substantially vertically from a major surface of the sheet and extend away therefrom; attaching one or more capacitors to the sheet; and attaching an assembly of the one or more capacitors, the sheet and at least some of plurality of pillars to one of a top or bottom of the one or more inductors to electrically connect the assembly and the one or more inductors.

In Example 18, the subject matter of Example 17 optionally includes wherein one or more inductors comprise a second assembly including one or more pillars and at least one cross trace electrically shorting the one or more inductors, and wherein the at least some of plurality of pillars are electrically connected to the at least one cross trace.

In Example 19, the subject matter of any one or more of Examples 17-18 optionally include stamping the sheet to form one or more windows therein; and removing portions of the sheet around the one or more windows to electrically isolate remaining portions of the sheet having the plurality of pillars attached thereto.

In Example 20, the subject matter of Example 19 optionally includes wherein the one or more capacitors are positioned to extend across the one or more windows.

In Example 22, the apparatuses or method of any one or any combination of Examples 1-20 can optionally be configured such that some or all elements or options recited are available to use or select from.

These and other examples and features of the present apparatuses and systems will be set forth in part in the following Detailed Description. This Overview is intended to provide non-limiting examples of the present subject matter—it is not intended to provide an exclusive or exhaustive explanation. The Detailed Description below is included to provide further information about the present apparatuses and methods.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. An apparatus for an electronics package comprising:
   one or more magnetic inductors;
   one or more capacitors positioned one of above or below to the one or more magnetic inductors and insulated therefrom;
   a plurality of electrical conductors comprising pillars that extend substantially vertically to electrically connect the one or more magnetic inductors and the one or more capacitors to the electronics package, the one or more capacitors and the plurality of conductors are disposed one of above or below the electronics package; and
   at least one electrical conductor comprising a pillar extending substantially vertically to electrically connect only with the one or more magnetic inductors and the one or more capacitors.

2. The apparatus of claim 1, wherein the least one electrical conductor is electrically connected to a voltage discharge end of the one or more magnetic inductors.

3. The apparatus of claim 1, wherein at least one of the plurality of electrical conductors is electrically connected to a voltage input end of the one or more magnetic inductors.

4. The apparatus of claim 1, wherein the one or more magnetic inductors and the one or more capacitors are arranged and electrically connected by the plurality of electrical conductors and the at least one electrical conductor such that each of the one or more magnetic inductors comprise an output voltage filter inductor and each of the one or more capacitors comprise an output voltage filter capacitor.

5. The apparatus of claim 1, wherein the one or more magnetic inductors and the one or more capacitors are arranged and electrically connected by the plurality of electrical conductors and the at least one electrical conductor such that the one or more capacitors are separated into a first group that comprise output voltage filter capacitors and a second group that comprise input voltage filter capacitors.

6. The apparatus of claim 1, wherein one or more of the plurality of electrical conductors and the least one electrical conductor are varied by one or more of a position, circuit type and number to suit different dc-dc power converter topologies.

7. The apparatus of claim 1, wherein the one or more capacitors are positioned one of relatively closer to or relatively further from the electronics package than the one or more magnetic inductors.

8. The apparatus of claim 1, wherein the one or more capacitors are arranged relative to the one or more inductors to create one of an assembly with the one or more capacitors vertically stacked so as to be disposed directly above or below the one or more magnetic inductors or an assembly with the one or more capacitors are offset from the one or more inductors along a major surface of the electronics package.

9. The apparatus of claim 1, wherein the electronics package comprises a voltage regulator along with at least one or more inductors, one or more capacitors and active circuit components such as semiconductor switches.

10. The apparatus of claim 1, wherein the apparatus is configured as one or both of a buck converter circuit and a boost converter circuit.

11. An apparatus for an electronics package comprising:
one or more magnetic inductors;
a capacitor array positioned one of above or below the one or more magnetic inductors and insulated thereform; and
a plurality of electrical conductors that electrically connect the one or more magnetic inductors and the capacitor array to the electronics package;
a plurality of electrical conductors comprising pillars that extend substantially vertically to electrically connect one of the one or more magnetic inductors or the one or more capacitors to the electronics package;
wherein the capacitor array is embedded in a package core of the electronics package.

12. The apparatus of claim 11, wherein at least some or all of the plurality of electrical conductors comprise pads exposed at a top surface thereof and positioned at a package build up layer of the electronics package.

13. The apparatus of claim 11, wherein one or more capacitors of the capacitor array are electrically connected by one or more of the plurality of electrical conductors to the electronics package to provide filtering for one or more voltage outputs, one or more voltage inputs, or other power rails of the electronics package.

14. The apparatus of claim 11, wherein the one or more magnetic inductors are embedded in the package core layer.

15. The apparatus of claim 11, wherein the apparatus is configured as one or both of a buck converter circuit and a boost converter circuit.

16. The apparatus of claim 11, wherein the capacitor array comprises an interdigitated capacitor array.

* * * * *

UNITED STATES PATENT AND TRADEMARK OFFICE
CERTIFICATE OF CORRECTION

PATENT NO. : 10,453,705 B2
APPLICATION NO. : 15/865471
DATED : October 22, 2019
INVENTOR(S) : Jain et al.

Page 1 of 1

It is certified that error appears in the above-identified patent and that said Letters Patent is hereby corrected as shown below:

In the Claims

In Column 18, Line 58, in Claim 8, delete "o£" and insert --of:-- therefor

Signed and Sealed this
Twenty-sixth Day of January, 2021

Drew Hirshfeld
*Performing the Functions and Duties of the*
*Under Secretary of Commerce for Intellectual Property and*
*Director of the United States Patent and Trademark Office*